United States Patent
Keister et al.

(10) Patent No.: US 10,698,010 B2
(45) Date of Patent: Jun. 30, 2020

(54) COMBINED CURRENT AND VOLTAGE SENSOR FOR HIGH VOLTAGE ELECTRIC POWER LINES

(71) Applicant: Southern States, LLC, Hampton, GA (US)

(72) Inventors: Josh Keister, Hampton, GA (US); Joseph R Rostron, Hampton, GA (US); Jiyuan Fan, Hampton, GA (US); Tan Tran, Hampton, GA (US)

(73) Assignee: Southern States, Hampton, GA (US)

( * ) Notice: Subject to any disclaimer, the term of this patent is extended or adjusted under 35 U.S.C. 154(b) by 229 days.

(21) Appl. No.: 15/971,968

(22) Filed: May 4, 2018

(65) Prior Publication Data

US 2018/0321285 A1    Nov. 8, 2018

Related U.S. Application Data

(60) Provisional application No. 62/501,798, filed on May 5, 2017.

(51) Int. Cl.
| | | |
|---|---|---|
| *G01R 19/25* | (2006.01) | |
| *G01R 21/06* | (2006.01) | |
| (Continued) | | |

(52) U.S. Cl.
CPC ....... *G01R 19/2513* (2013.01); *G01R 15/142* (2013.01); *G01R 15/18* (2013.01);
(Continued)

(58) Field of Classification Search
CPC .... G01R 15/142; G01R 15/18; G01R 15/181; G01R 15/16; G01R 15/183;
(Continued)

(56) References Cited

U.S. PATENT DOCUMENTS

| 5,942,889 A | 8/1999 | Loewenhardt et al. |
| 6,677,743 B1 | 1/2004 | Coolidge et al. |
| (Continued) | | |

FOREIGN PATENT DOCUMENTS

EP    2408062 A1    1/2012

*Primary Examiner* — Melissa J Koval
*Assistant Examiner* — Rahul Maini
(74) *Attorney, Agent, or Firm* — Mehrman Law Office; Michael J. Mehrman

(57) ABSTRACT

A high voltage electric power line monitor includes a current sensor, a voltage sensor, an energy harvesting power supply, and a communication device. The monitor is supported by an overhead power line support structure, such an insulator housing a sectionalizing switch. The current sensor coil and the energy harvesting coils are positioned transverse to the power line with the power lane passing through the coils. A foil patch voltage sensor and a communications antenna are carried on an electronics board positioned parallel to the monitored power line, typically below the current sensor. Both the current sensor and the voltage sensor are positioned adjacent to, but spaced apart from, the monitored power line creating an air gap between the monitor and the power line. The sensors are housed within a Faraday cage to shield the current sensor from electromagnetic contamination.

20 Claims, 4 Drawing Sheets

(51) Int. Cl.
  *G01R 15/14* (2006.01)
  *G01R 21/133* (2006.01)
  *H05K 9/00* (2006.01)
  *G06F 1/26* (2006.01)
  *G01R 15/18* (2006.01)
  *G01R 15/16* (2006.01)

(52) U.S. Cl.
  CPC ........... *G01R 15/181* (2013.01); *G01R 21/06* (2013.01); *G01R 21/133* (2013.01); *G06F 1/26* (2013.01); *H05K 9/0081* (2013.01); *G01R 15/16* (2013.01); *G01R 15/183* (2013.01)

(58) Field of Classification Search
  CPC .. G01R 19/2513; G01R 21/06; G01R 21/133; G06F 1/26; H05K 9/0081
  USPC .......................................................... 324/72
  See application file for complete search history.

(56) References Cited

U.S. PATENT DOCUMENTS

| | | | |
|---|---|---|---|
| 9,804,201 B2* | 10/2017 | Young | G01R 15/18 |
| 9,945,692 B2* | 4/2018 | Leeb | G01R 15/207 |
| 2001/0000683 A1 | 5/2001 | Holce et al. | |
| 2006/0214849 A1 | 9/2006 | Fabrega-Sanchez et al. | |
| 2008/0077336 A1 | 3/2008 | Fernandez | |
| 2015/0304487 A1 | 10/2015 | Chaput et al. | |
| 2018/0306839 A1* | 10/2018 | Donnal | G01R 15/165 |

* cited by examiner

COMBINED CURRENT AND VOLTAGE SENSOR FOR HIGH VOLTAGE ELECTRIC POWER LINES

REFERENCE TO RELATED APPLICATION

This application claims filing priority to U.S. Provisional Patent Application Ser. No. 62/501,798 filed May 5, 2017, which is incorporated by reference.

TECHNICAL FIELD

The present invention relates to the field of high voltage electric power transmission and distribution systems and, more particularly, to a combined current and voltage electric power sensor with an onboard energy harvesting power supply and wireless communication device.

BACKGROUND OF THE INVENTION

At present, ring-type current transformers ("CTs") are the most prevalent technology for measuring phase currents in three-phase electric power transmission and distribution lines. Conventional CTs are often placed in physical contact with the monitored power line conductor, which results in excessive heating of the CT and the power line. Excessive heating can adversely impact electronics in the CT and limit the current carrying capacity of the power line. Conventional CTs are also limited to electric current measurement, resulting in the need for separate voltage sensors when both current and voltage measurement are desired. Conventional CTs also require separate radios to transmit the current measurements to controllers or remote transmission units (RTUs). These radios are typically powered by batteries or separate low voltage wiring. Batteries require periodic maintenance, while low voltage wiring requires a nearby transformer, which increases the cost and maintenance requirements.

In addition to current measurement, power line voltage measurement is also useful for "smart grid" electric power system monitoring, protection and control. Traditional voltage measurement devices, while accurate, are expensive and physically large, which limits the number of electric power circuit locations where they can be cost effectively be deployed. High voltage sensors are presently available, but the conventional voltage sensing techniques are usually sensitive to electromagnetic interference errors (also referred to as "cross talk" or "contamination") caused by other high voltage power lines and devices in close proximity. In addition, many conventional voltage sensors are non-directional, which renders them particularly susceptible to electromagnetic contamination. Electromagnetic contamination also impairs the measurement of the voltage phase angle, which is critical for VAR measurement, capacitor switching for voltage support, and sophisticated direction-to-fault and distance-to-fault sectionalizing techniques.

A high voltage sensor in the form of a circuit board carrying a foil patch sensor has been used to obtain advantages over physically large capacitor and transformer-based systems. The small size and low cost of foil patch sensors allows for information gathering at a larger number of measurement points, which provides more accurate and robust determination of power outages and poor power quality conditions. However, conventional capacitive foil patch sensors are typically non-directional, which makes them susceptible to significant cross talk from nearby high voltage power lines and devices. While a line mounted patch sensor with a ground plane positioned adjacent to the power line experiences relatively good coupling to the power line, nearby power lines and other high voltage devices, such as disconnect switches and equipment bushings, can still cause significant cross talk.

Conductive shielding and mathematical filtering are other techniques that have been used to avoid or compensate for electromagnetic cross talk. However, conductive shielding can be physically challenging to design and mathematical filtering is complicated by variations in capacitance caused by changing environmental factors. Voltage sensors are generally physically mounted to a support made from a dielectric medium, such as epoxy, Teflon or porcelain. While the nominal capacitances of these materials are generally well known, the actual capacitance in the field can vary significantly with changes in environmental temperature, moisture and surface contamination. For example, the sensor capacitance can change with changes in physical dimensions resulting from thermal expansion. Power line conductors experience physical sag, which can be significantly impacted by the ambient temperature. In addition, the intrinsic dielectric constant of some materials can change with temperature. While the majority of these effects can be compensated for by measuring the temperature of the local mechanical support and using a calibration table to account for these changes in capacitance, this increases the cost and complexity of the measurement system.

Moreover, temperature compensation may not be sufficient in some cases because sensor performance can also vary significantly due to the surface condition of the physical sensor support. Any type of electrically conductive surface contamination can drain the electric charge from the sensor and impact the phase angle response characteristic of the sensor. These parasitic effects are caused by a resistive layer, such as water, ice, oxidation or grime, on the surface of the sensor support or housing. Resistive surface contamination can significantly change the measured phase angle with respect to the voltage field and reduce the signal magnitude available to measure. Moisture or high humidity in the ambient air can exasperate these sensor impacts. While these contamination effects do not significantly influence the high voltage field itself, they do affect the signal measurement in both magnitude and phase angle.

As a result, there is a persistent need for improved current and voltage sensors for high voltage power lines. There is a particular need for high voltage electric power line monitors capable of measuring AC currents and voltages with onboard communication features suitable for placement in many circuit locations in smart-grid applications.

SUMMARY OF THE INVENTION

The present invention meets the needs described above through an electric power monitoring device, system and method for a monitored overhead electric power line. In an illustrative embodiment, a bracket supports the monitoring device adjacent to a switch. The monitoring device includes a flange and a base, where the flange defines an aperture with the monitored power line extending through the aperture transverse to and spaced apart from the monitored power line. The base is positioned parallel to and spaced apart from the monitored power line. An electronics board disposed in the base carries a foil patch voltage sensor that measures an electric voltage on the monitored power line. The board also carries a foil patch antenna and electronic components including a microprocessor, a memory and a radio operatively connected to the antenna. A current sensing coil disposed in the flange surrounding the aperture measures an electric current flowing in the monitored power line. A power supply coil disposed in the flange surrounding the aperture harvests electric power from the monitored power line to electrically power the electronic components to cause the antenna to wirelessly transmit the measured voltage and current. A controller receives the voltage and current measurements from the electric power current and voltage monitoring device and generates a switch operation signal based on one or both of the voltage and current measurements. A switch actuator operates the switch based on the switch operation signal received from the controller.

The electric power current and voltage monitoring system may also include a remote transmission unit that receives the current and voltage measurements and transmits them to a control center. An antenna shield may be carried by the electronics board shielding the antenna from electromagnetic interference from the power line. The foil patch voltage sensor and the foil patch antenna may be disposed on one side of the electronics board, with the electronic components and the antenna shield disposed on the opposing side of the electronics board. A Faraday cage may shield the current sensing coil and the electronics board from electromagnetic interference from sources other than the power line. A corona ring may be positioned adjacent to the base. The antenna may include two elements that communicate signals at orthogonal polarities to provide multi-element, dual polarity communication reliability.

The specific techniques and structures for implementing particular embodiments of the electric power monitoring and response system, and thereby accomplishing the advantages described above, will become apparent from the following detailed description of the embodiments and the appended drawings and claims.

BRIEF DESCRIPTION OF THE DRAWINGS

FIG. 3 is a perspective view of the combined electric current and voltage monitor.

DETAILED DESCRIPTION OF ILLUSTRATIVE EMBODIMENTS

Figure 1:
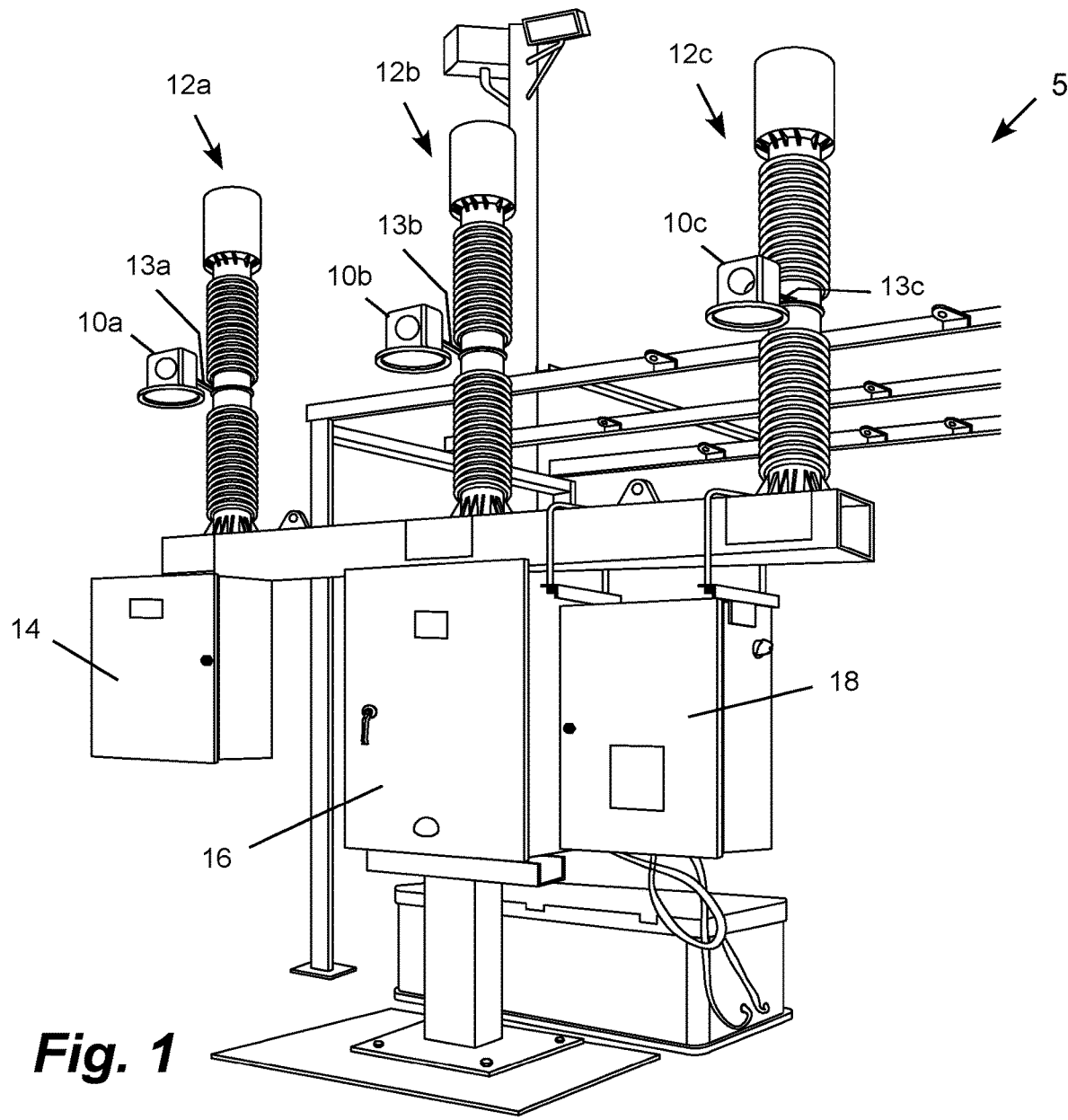
FIG. 1 is a perspective view of a high-voltage power line switch including three combined electric current and voltage monitors supported by respective switches.

The present invention may be embodied in a high voltage electric power line monitor including a current sensor, a voltage sensor, an energy harvesting power supply, and a communication device. The combined electric current and voltage monitor is configured to be supported by a structure, such a sectionalizing switch disposed within an insulator cylinder. The switch also supports the power line monitored by the current and voltage sensors. The current sensor coil and an energy harvesting device (e.g., inductive coil) are configured to surround and be positioned transverse to the monitored power line with the power line extending through an aperture formed by the current sensor. The voltage sensor is carried on an electronics board configured to be positioned parallel to the monitored power line, typically below the current sensor. Both the current sensor and the voltage sensor are configured to positioned adjacent to, but spaced apart from, the monitored power line. The current sensor and power supply coil are housed within a Faraday cage that is open in the direction of the power line to shield the current sensor from electromagnetic contamination from other sources. The Faraday cage also surrounds the electronics board while leaving the board open in the direction of the power line to shield the voltage sensor from electromagnetic contamination from other sources. The voltage sensor and communications antenna are configured as foil patches carried on an electronics board. An advantage of wireless sensor measurement for voltage or current is that there is no risk of an insulation failure or safety hazard with a breakdown to the low voltage side from the high voltage line. Although the power line monitor does not require a separate power supply, the electronics board may carry a backup battery if desired. The voltage sensing plate and housing may be protected with a material that contains oil or another hydrophobic substance. Surface treatments for the foil patches should generally be applied to housing materials as well.

A typical circuit monitoring and control installation includes three combined current and voltage sensors (one for each line phase), a controller, a switch actuator, and an optional analog module for interfacing with electronic relays and a remote transmission unit (RTU). The system may provide real time waveform captures. Specialized algorithms may be programmed into the controller. Typical applications include sectionalizing switches, switches that determine distance-to-fault and direction-to-fault, renewable generation tie switches, load tie switches, automatic reclosers, EHV monitoring, capacitor bank control, voltage regulator control, transformer protection, reactor switch control, and so forth. For example, the combined current and voltage sensor can be used in the fault detection, isolation and restoration systems described in U.S. Pat. Nos. 8,392,130; 8,659,862; 8,717,721; 8,861,155; 8,866,487; 9,823,637 and 9,581,624, which are incorporated by reference.

FIG. 1 is a perspective view of a high-voltage power line switch 5 that includes three combined electric current and voltage monitors 10a-c known as Integrated Circuit Sensor (ICS) units supported by respective electric power switches 12a-c (e.g., sectionalizing switches). Each ICS unit 10a-c has an aperture (hole) allowing the unit to surround an associated power line near the connection of the power line to the circuit switches 12a-c. Each ICS unit 10a-c is supported by a respective bracket 13a-c that positions the ICS unit so that the monitored power line connected to a respective switch passes through the hole in the ICS unit without physically contacting the ICS unit. Each ICS unit inductively measures current and capacitively measures voltage on its respective power line and transmit those measurements wirelessly to a controller unit 14. This particular illustrative power line switch 5 also includes an actuator 16 for operating the switch based on the current and/or voltage measurements. This installation also includes a Remote Transmission Unit (RTU) 18 (such as a SCADA unit) for communicating the power line measurements to local and/or remote control centers, which may record, analyze and display the power line measurements and control a variety of response equipment based on the power line measurements and associated computations.

The ICS units are typically capable of capturing three phase GPS location and time stamped voltage and current waveforms both before and after fault events using a common reference clock (e.g., common GPS clock), which may be stored, analyzed and used for real-time power system control. Three phase voltage and current monitoring enables distance-to-fault local or remote controllers to conduct distance-to-fault and direction-to-fault computations, and control response equipment, such as sectionalizing switches, tie switches, capacitor switches, reactor switches, voltage regulators, renewable generation sources, load switches, and so forth. One important function, for instance, is to detect back-fed power from distributed generation sources (e.g., solar panel generators) during power line fault detection and restoration to enhance safety during fault isolation and restoration.

Figure 2:
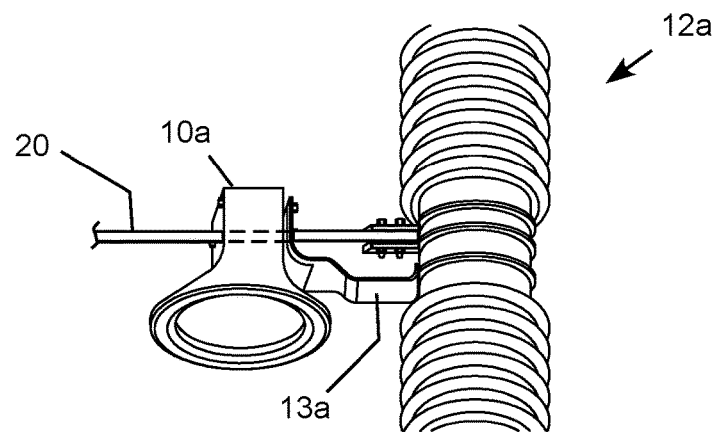
FIG. 2 is a perspective view of a combined electric current and voltage monitor supported by a switch.

FIG. 2 is a perspective view of one of the ICS units 10*a* supported by a bracket 13*a* from one of the switches 12*a*, which also supports a power line 20. The bracket 13*a* positions the ICS unit 10*a* so that a current sensor coil (e.g., Rogowski coil) and an energy harvesting coil (e.g., inductive coil) inside the ICS unit are positioned transverse to the monitored power line 20 with the power line extending through the aperture (hole) formed by the ICS unit. The voltage sensor is carried on an electronics board positioned parallel to the monitored power line 20, typically below the current sensor. Both the current sensor and the voltage sensor are positioned adjacent to, but spaced apart from, the monitored power line 20. The current sensor and energy harvesting coil are housed within a Faraday cage that is open in the direction of the power line to shield the current sensor from electromagnetic contamination from other sources. The voltage sensor and communications antenna are configured as capacitive foil patches carried on the electronics board positioned at the bottom of the Faraday cage. The Faraday cage surrounds the perimeter of the electronics board to shield the voltage sensors and the antenna elements from electromagnetic interference propagating from the sides of the ICS unit. The Faraday cage is open at the bottom in the direction of the power line to facilitate the operation of the voltage sensors. The cover plate on the bottom of the ICS unit is typically made of a non-conductive plastic material to avoid interfering with radio communications with the electronics board. The Faraday cage is also open at the bottom in the downward direction to facilitate radio signals in that direction from the foil patch antenna elements on the electronics board. The electronics board may carry conductive shields overlying the foil patch antenna elements to shield the antenna elements from electromagnetic interference propagating from the monitored power line. Similarly, the cover plate may carry conductive shields overlying the foil patch voltage sensors to shield the voltage sensors from electromagnetic interference propagating from below the ICS unit. Although the power line monitor does not require a separate power supply, the electronics board may carry a backup battery if desired or be connected to a low voltage power source if desired.

Figure 4A:
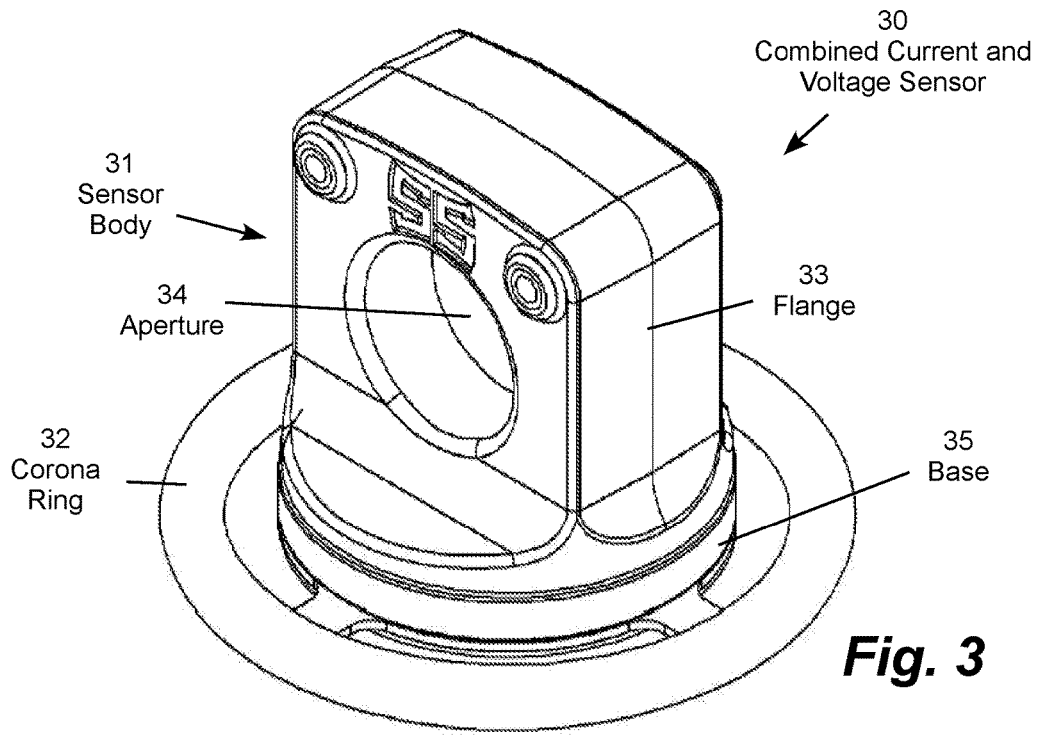
FIG. 4A is conceptual illustration of the top side of an electronics board in the combined electric current and voltage monitor.
Figure 4B:
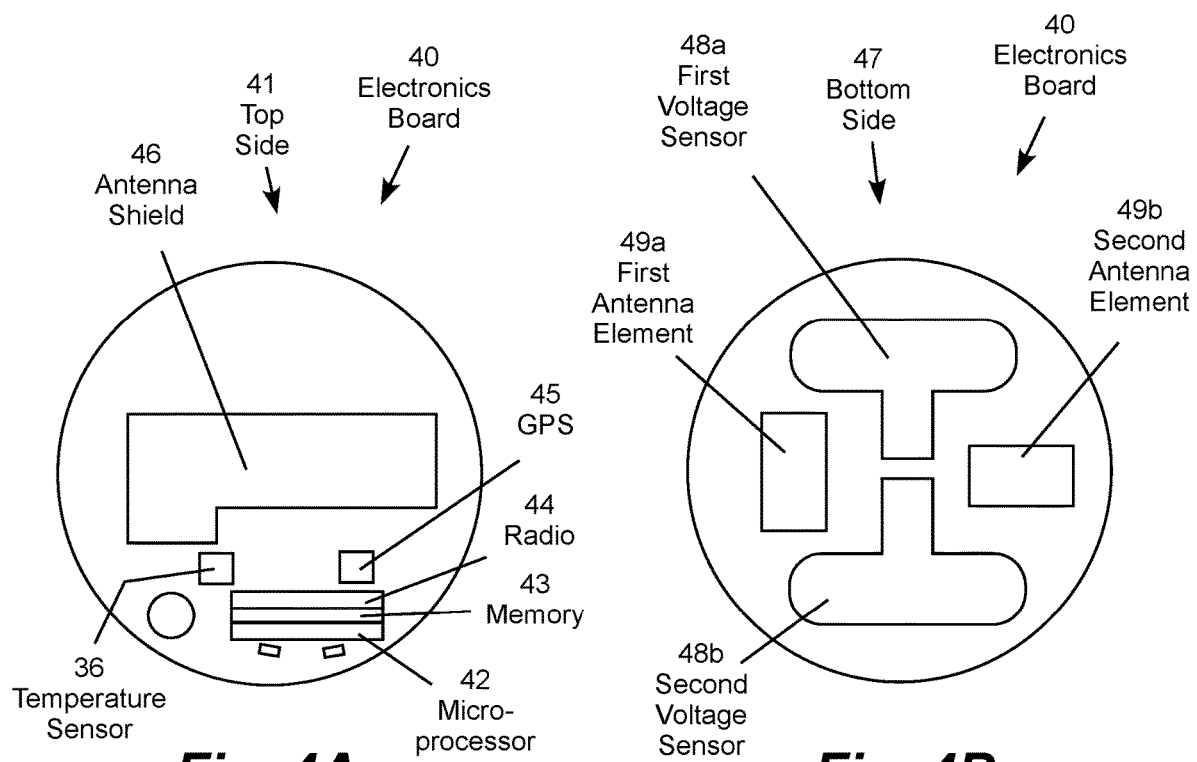
FIG. 4B is conceptual illustration of the bottom side of the electronics board in the combined electric current and voltage monitor.

FIG. 3 is a perspective view of an illustrative combined electric current and voltage monitor 30 including a sensor body 31 and a corona ring 32. The sensor body 31 includes a flange 33 forming an aperture (hole) 34 that houses the current transformer coil and energy harvesting coil. The sensor body 31 also includes a base 35 that houses an electronic board, which carries the voltage sensor and the wireless communication device as shown in FIGS. 4A and 4B. The monitored power line passes through the hole 34 without physically contacting the sensor body 31, which positions the power line adjacent to but spaced apart from, the current transformer and energy harvesting coil in the flange portion 32. The power line is also positioned adjacent to the voltage sensor carried on the electronics board in the base portion 35 of the sensor body 31.

FIG. 4A is conceptual illustration of the top side 41 of the electronics board 40, which faces toward the monitored power line. The top side carries the electronic components including a microprocessor 42, memory 43, radio 44, GPS unit 45, temperature sensor 36 and supporting components. The microprocessor typically performs additional functions including GPS position and time stamp determination for captured voltage and current waveforms. The microprocessor, memory, radio and GPS elements may be configured as a single chip or as multiple chips as a matter of design choice. This side of the board also includes an antenna shield 46 positioned between the monitored power line and the antenna elements on the other side of the electronics board. The antenna shield 46 effectively forms a conductive Faraday shield that protects the foil patch antenna elements and associated signal traces from electromagnetic interference radiating from the monitored power line and other sources. For example, the antenna shield 46 may be an aluminum enclosure sealed to the top side of the electronics board. While a variety of radio channels maybe used, the radio 44 may use the 2.4 GHz and/or 900 MHZ radio bands radio band. The microprocessor on the electronics board uses the temperature measurement signal from the temperature sensor 36 for temperature compensation in the computation of the current and/or voltage of the monitored power line.

FIG. 4B is conceptual illustration of the bottom side 47 of the electronics board 40, which faces away from the monitored power line. This side carries foil patches including first and second lobe shaped voltage sensors 48*a-b* along with first and second antenna elements 49*a-b*. While the antenna shield 46 is positioned over the antenna elements, most of the voltage sensors 48*a-b* are not shielded from the monitored power line. The radio 44 is operatively connected to the antenna elements 49*a-b* to communicate power line measurements to other devices, such as the controller 14 and RTU 18 shown in FIG. 1. The antenna elements 49*a-b* typically communicate signals at orthogonal polarities to provide multi-element, dual polarity communication reliability.

In this embodiment, the voltage sensors 48*a-b* and antenna elements 49*a-b* are configured as foil patches disposed on the circuit board to provide an inexpensive yet highly robust design. The illustrative ICS unit advantageously includes dual voltage sensors 48*a-b* with separate capacitive sensors and signal paths, along with dual antenna elements 48*a-b* with separate signal paths. As an option, each voltage sensor patch operates on a different radio frequency, and each antenna patch operates on a different radio frequency, to provide a dual redundant radio design. This option enhances radio robustness by preventing random radio signals that interfere with any one radio frequency from fully interrupting the sensor. As radio frequency interference typically occurs on a single frequency at any particular time, the dual redundant radio design of the ICS unit provides inherent reliability for transmission of real time measurement data. As another option, data packet transmissions are repeated in time as another technique to enhance transmission reliability. In other words, each data packet transmission is duplicated during one or more subsequent time intervals. On a power system, power fault and surge events typically interrupt RF operation for very short periods in the millisecond range. Repeating the transmission of a data packet after a few milliseconds is therefore an effective way of ensuring that the information in the packet is not lost due to a typical power line surge or fault event.

In addition, the voltage sensors 48a-b itself can be used as a trickle charger for the power supply. This technique is useful for periodically transmitting "I'm alive" heart beat type signals regardless of whether the inductive power supply coil is generating power. As a result, this energy harvesting technique is operative when the monitored power line has voltage but does not require current to be flowing on the monitored power line. Due to the small amount of power harvested with this technique, it is best suited to producing a periodic status alert. As additional options, trickle charge energy can be harvested from an RF signal transmitted by a ground-based transmitted or even the signals transmitted by cell phone towers, SCADA towers, or other sources of RF energy in the ambient environment. See, for example, U.S. Pat. No. 8,392,130, which is incorporated by reference.

The illustrative ICS 30 includes a single set of electronics along with dual foil patch voltage sensors and antenna elements. The ICS may also or alternatively include duplicate sets of electronics, which may provide for greater improvement in reliability than duplicate foil patch elements because the electronics may be more subject to occasional failure in the harsh electrical environment of a high voltage power line or substation. In various options, dual electronics may be used with single or foil patch dual voltage sensors and/or single or dual foil patch antenna elements.

Figure 5A:
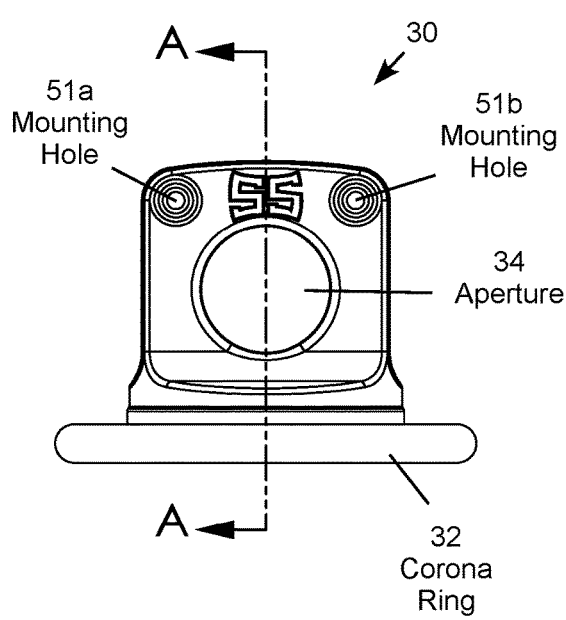
FIG. 5A is a front view of the combined electric current and voltage monitor.
Figure 5B:
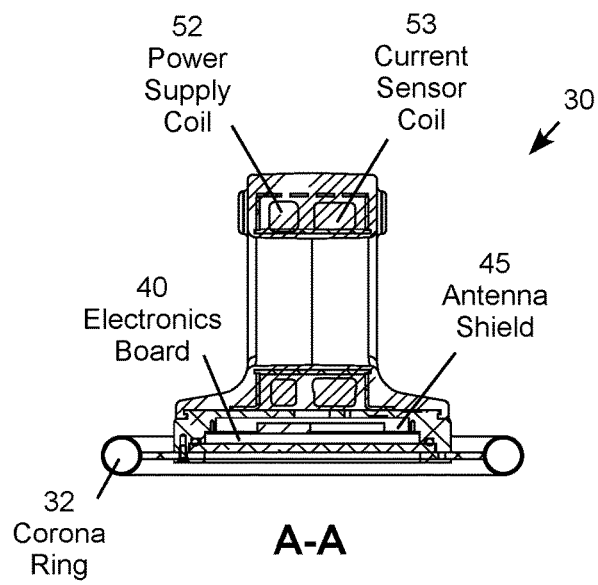
FIG. 5B is a side section view of the combined electric current and voltage monitor.
Figure 5C:
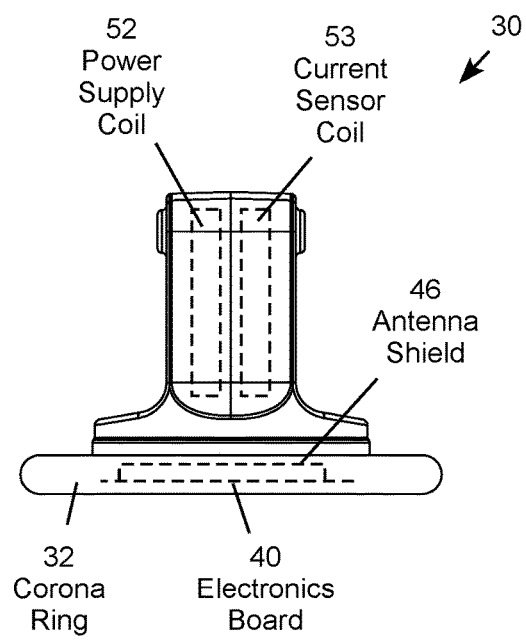
FIG. 5C is a side view of the combined electric current and voltage monitor.
Figure 5D:
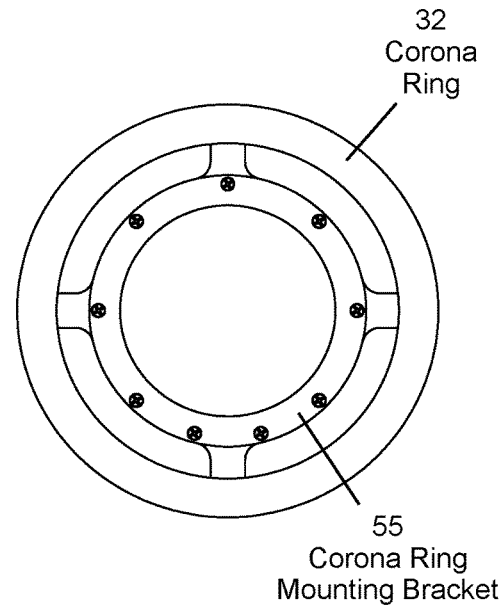
FIG. 5D is a bottom view of a corona ring for the combined electric current and voltage monitor.

FIG. 5A is a front view, FIG. 5B is a side section view, and FIG. 5C is a side view of the ICS unit 30. This particular embodiment includes two mounting holes 51a-b that can be used in lieu of or in addition to a mounting bracket to position the ICS unit in a desired position around a monitored power line. FIG. 5A shows the section line A-A for the section view of FIG. 5B. The ICS unit 30 is shown approximately to scale where the aperture 34 is approximately 3 inches (7.6 cm) in diameter and the corona ring 32 is approximately 10 inches (25.4 cm) in diameter. FIG. 5B and FIG. 5C show certain internal components including the power supply inductive coil 52, the current sensor inductive coil 53, the electronics board 40 and the antenna shield 46. FIG. 5D is a bottom view of the corona ring 32 also showing the corona ring mounting bracket 55.

Figure 6:
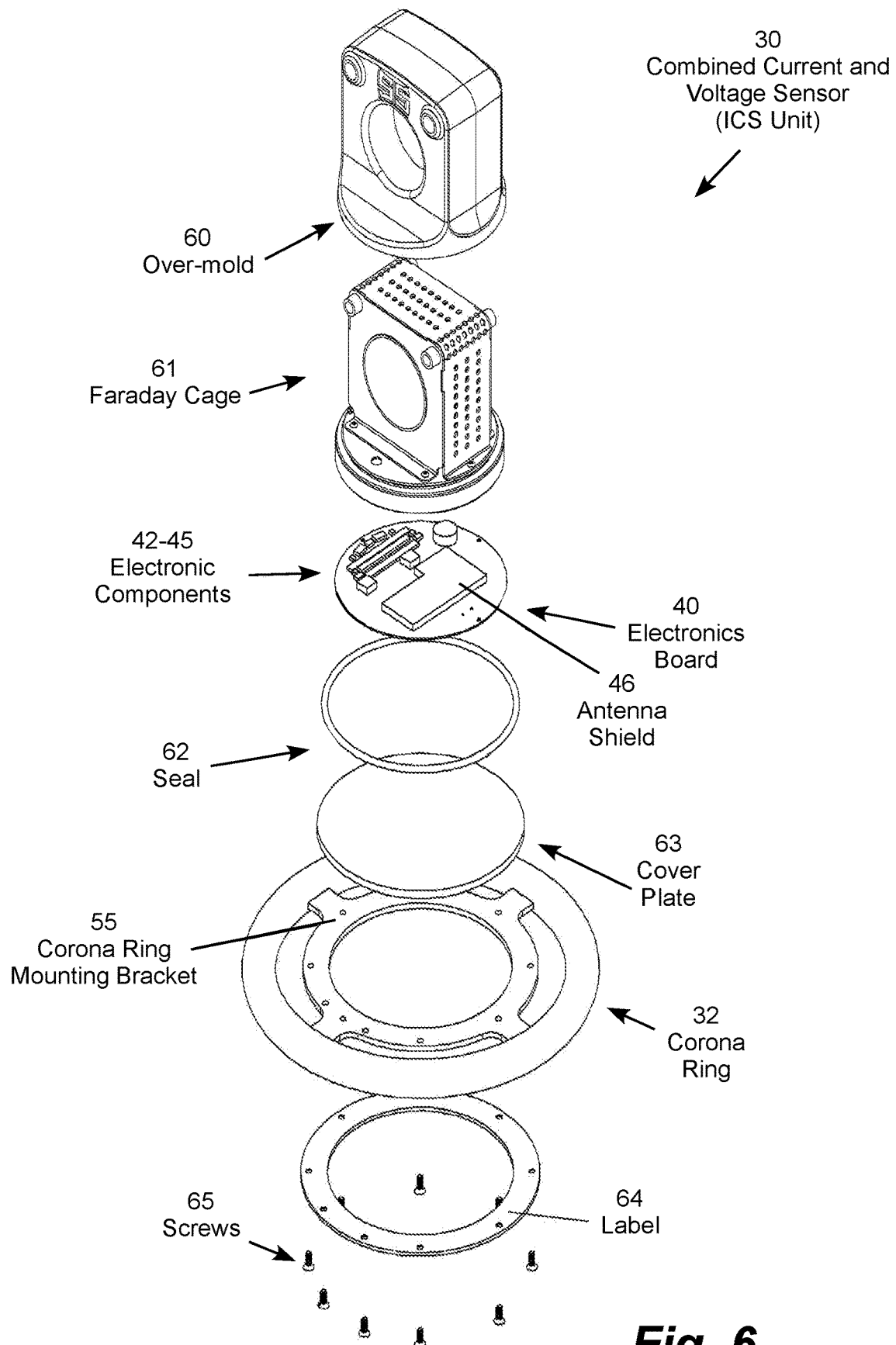
FIG. 6 is an assembly view of the combined electric current and voltage monitor.

FIG. 6 is an assembly view of the combined electric current and voltage monitor 30 showing the corona ring 32, the corona ring mounting bracket 55, the electronics board 40, the electronic components 42-45 and supporting electronic components, and the antenna shield 46 positioned to shield the antennal elements and associated signal traces from electromagnetic interference from the monitored power line. This view also shows an outer over-mold 60 made from a rugged plastic material (e.g., Lexan, Nylon or other suitable material) that protects the unit from the weather elements. A Faraday cage 61 (e.g., aluminum or other suitable electric conductor) is located under the over-mold to shield the sensors from electromagnetic interference from sources other than the monitored power line. A flexible seal 62 (e.g., Neoprene or other suitable material) and non-conductive cover plate 63 (e.g., Lexan, Nylon or other suitable material) encloses the bottom of the unit. Screws 65 that thread into holes in the Faraday cage 61 attach a label 64, the corona ring mounting bracket 55, and the cover plate 63 to the unit.

The ICS unit 30 is shown approximately to scale in the figures where the corona ring is approximately 10 inches (24.5 cm) in diameter. The ICS unit is suitable for power line voltages in the 15 kV to 800 kV range with current sensing up to 4,000 Amps continuous current and 40,000 Amps fault current. A typical ICS unit is capable of serial and ethernet wireless communications including DNP 3.0 Modbus protocol. The ICS unit is remotely programmable and compatible with digital relays and RTUs used for automated, remote or manual circuit switching. The typical ICS sensing units do not require batteries and are sealed for life requiring no maintenance. The ICS is a digital measurement and control systems designed as a solutions platform for transmission networks. It is designed to operate in the same harsh environments as transmission substations and power lines. The ICS unit provides information currently not available on transmission networks on an economic and performance scale previously unrealized.

The ICS unit is a relatively small and light weight sensor system that is suitable for the smart-grid application relying on many points of measurement in the electric power system that would otherwise not be possible. These applications are suitable for overhead lines where the poles are tall and slender, and therefore not able to take the heavy weight of conventional capacitor and transformer-based voltage monitors. The ICS unit is particularly well suited for use with sectionalizing switches where multiple switches located at multiple monitoring and switch points provide fault detection, isolation and restoration. Variations of the sensor may also be deployed as a current-only sensor and as a voltage-only sensor, as desired for various applications.

Capacitance variations in the voltage sensor caused by environmental factors and resistive coupling to the physical support structure can affect the phase angle between the measured current and the measured voltage by as much as 90 degrees, which is a most undesirable consequence. To mitigate these effects, the voltage sensor is electrically connected to the high voltage conductor by a measurement resistor. The current through the measurement resistor is then measured, rather than the voltage of the patch element directly. While the measurement resistor is sufficiently large to keep the sensor current to the microamp range, it is at least an order of magnitude smaller than the parasitic resistance of the support structure, which effectively drowns out the capacitance distortion caused by the parasitic resistance. In this way, the contamination effects, which are predominantly resistive in nature, do not significantly change the phase angle between the measured current and voltage waveforms. Protecting the voltage sensing plate with a material that contains oil or another hydrophobic substance also minimizes surface contamination and oxidation.

The ICS unit can be used in applications where higher precision is needed, which would otherwise require the more bulky and expensive measurement systems. The ICS unit can also be used to obtain voltage as well as current measurements in locations where an accurate voltage reference is not conveniently available. This makes the ICS unit well suited to deployment on radial distribution lines, tie switches and load delivery points. In some cases, the measurement point may be spaced apart from and a particular location (e.g., customer premises location or equipment) creating systematic differences between the measurement point and that location or equipment. In these cases, the knowledge of the physical system configuration between the measurement point and the particular location can be used to determine the intrinsic difference in voltage magnitude and phase angle. Specifically, the length of the line and its configuration produces known and predictable changes in voltage along this line caused by the magnitude of the current flowing on the line and its length.

The ICS unit is also well suited for use in switching, relaying, protection and measurement systems that require fairly high accuracy. The ICS unit often achieves the desired accuracy in lieu of conventional techniques, which avoids the cost and weight of capacitor and transformer-based solutions. In another application, a nearby voltage reference signal is available from one phase with a high degree of accuracy. The ICS unit can be used to continuously update these measured signals with a correction factor to increase the intrinsic accuracy measurements. A voltage reference signal from another device can also be used when monitoring transient voltage and phase angle changes under dynamic conditions. In this case, the percent of change in the voltage reference signal is used to estimate the new voltage condition. When the nominal reference voltage is available, the transient measurement of the reference voltage provides a phase voltage measurement that is better than no information at all, which is accurate to the initial condition assumption. In general, the power line voltage is almost always within 10% of the nominal reference voltage and usually within 5% on the nominal condition. These errors result in power flow calculation errors that remain within usable tolerances for load monitoring functions to determine if power lines and transformers are overloaded, which can be used to determine whether additional load can be transported over the power lines.

The ICS unit can also be used in sectionalizing and other systems that utilize the concurrent voltage to current measurement for phase angle, distance-to-fault and direction-to-fault computations. The combined current and voltage measurements can also be used to compensate for the effect of phase angle error measurements on other systems that compute distance-to-fault estimates. This allows another distance-to-fault system that is intrinsically subject to environmental effects causing relatively low accuracy to be improved substantially, which may render another distance-to-fault system useful in areas that would not otherwise be acceptable.

The general methodology for making the voltage sensor is to utilize a circuit board with a relatively large area dedicated to the exposed high voltage field. This provides a relatively large area for picking up energy from the monitored power line. The capacitance of the voltage sensor can be determined by changing the size and shape of the foil patch and the thickness and material(s) used in the layer(s) between the foil sensing layer and the "ground" plane, which in this case is, in fact, the monitored power line. In other words, the voltage sensor forms a capacitor between the monitored power line and the foil patch, which accumulates electric charge on the foil patch. The high voltage on the power line therefore provides the "ground reference" for measuring the capacitance of the foil patch resulting from the charge induced from the power line. This approach allows the variations in capacitance between the signal plane and the ground plane to be controlled and optimized. Using a relatively large foil patch area produces a relatively large capacitance, which minimizes the effect of variations in capacitance caused by ambient variations and resistive surface contamination on the foil patch. Consistency from one unit to the next is enhanced by using consistent materials and manufacturing practices for the circuit boards to minimize performance variations caused by sub components or assembly variations. The exposed surface of the foil patch is typically flat, which facilitates mitigation techniques and surface treatments to keep moisture off the foil surface. This application of the "Lotus" effect prevents the wetting of the surface and hence minimizes the variations in resistance. Water in its pure form is not conductive and hence has very high resistance. With contamination, water becomes more conductive. A film of water across the surface of the circuit board can cause a change of resistance and hence contribute to measurement errors. The treatment of the surfaces of the circuit board hence minimizes the influence of variable, thus enhancing the consistency of measurements.

The ICS unit may utilize dual electronic measurement of current and voltage as well as dual processing of signals including transmitting and receiving data from the same physical device to enhance reliability. Frequency and antenna diversity reduce the probability of interference. Using antennas with different polarities reduces the susceptibility to interference further. Single frequency narrowband RF transmitters can be disrupted by bystander communication on the same frequency, while the ICS unit may employ two Direct Sequence Spread Spectrum (DSSS) channels simultaneously, rather than hopping between channels. Dual transmitters and receivers also eliminate a single point of failure concern as otherwise any single element can disrupt the signal chain with bad data. In addition, the two signals are compared at the receiving end and used to determine which has the correct uncorrupted signal. This data is spliced together to not allow interference or malfunction of either signal path to cause bad information or signal disruption. This cleansed data is then sent to monitoring and protection system for determining if an action is needed.

The ICS unit includes an onboard power supply coil to power the onboard electronics without the use of batteries or a wired connection. The power supply and current measurement inductive coils use super-saturation cores to prevent the dissipation of high amounts of energy at times when high currents and fault currents occur. This capability is enhanced by using a nano-crystalline core material to get higher output with less core material. This reduces the line current through the sensor electronics to be less than 5% of that previously obtained with thin high permeability nickel materials that cost more. Saturation may be enhanced by using a voltage regulating circuit that allows higher winding voltages compared to shorting semiconductors (e.g., triacs, MOSFETs, etc.) with low ON voltage. More Volts per turn increases the saturation, which limits the heat created in the sensor electronics, while simultaneously allowing more core cross-sectional area to harvest more energy at very low line currents. In addition to allowing operation at a lower current, the high output power supply also turns on quicker (a few milliseconds) to allow the sensor's use in detecting faults, whereas other sensors may take longer than the fault duration itself to power up.

The ICS unit also utilizes a "ground shield" carried on the circuit board as part of a Faraday cage to minimize interference on the antenna elements and associated signal traces from the power lone and other sources. The antenna elements and signal traces are located behind the shield positioned between these components and the monitored power line. A cup-shaped housing protects the electronics from moisture and high voltage that could interfere with signal processing and sensor measurement. The benefit of using the circuit board is that it can be used to simultaneously mount the voltage sensor and antenna foil patches on one side, while mounting the electronics and the antenna shield on the other side of the circuit board to eliminate bulky connectors, long signals and wired connections on the circuit board. The circuit board also allows for the signal traces from the antenna elements to the radio to be located under the antenna shield so that moisture or other contamination cannot get through.

It is well known that signal traces exposed to high voltage can disrupt signals and cause errors simply because of the high voltage field of application. The arrangement of the patch voltage sensor and antenna elements on the circuit board allows these components to be protected from stray and impulse voltages by placing circuit protection on the circuit board. The cost effectiveness and reliability of the board-mounted antenna shield is significantly enhanced by incorporating the shield on the circuit board rather than using a separate component. This board-mounted shield also provides a mechanical protection zone where potting or filling voids with a mechanical covering filler is then made to avoid moving or lifting of tiny board components. The board-mounted shield can also be configured to create a sealed compartment that protects against any effects of moisture ingress that could damage otherwise unprotected circuit elements. Any compound physically touching surface mount components can exert forces due to different coefficients in thermal expansion that cause them to detach. The board-mounted shield provides a "soft" interface that creates an air chamber between the shield and the electronic components that eliminates this potential issue.

Using a bracket to mechanically mount the ICS unit with the current sensor and power supply coils surrounding but spaced apart from the power line increases current carrying capacity of the monitored power line by avoiding interference with thermal heat transfer or air flow to the power line conductor or bus. Physically floating the current sensor around the conductor, and the voltage sensor adjacent to the conductor, without being in direct contact with the conductor, also increases the thermal impedance between the conductor and the sensors. As a result, the power line conductor can reach temperatures in excess of 100° C. without increasing the temperature of the sensor electronics above the maximum rating. The support brackets also allow the sensor to use higher gain antennas that may be aimed toward the monitored power line to avoid interference. The ICS unit also has the advantage of being sufficiently cost effective to allow ICS units to be installed on many circuit monitoring points, from transmission down to distribution voltages, with the ability to send power line monitoring signals to ground potential receivers without having to make structural changes to existing bus structures or other equipment.

The voltage sensor uses a foil patch on the circuit board which is exposed to the high voltage electric field. The voltage on the foil is proportional to the system voltage. This may change depending on the mechanical geometry of the sensor, which may require calibration and/or testing for each configuration or installation. As there are generally other voltage sources in the environment, such as other phases and perhaps other power lines, these other voltage sources produce electric fields other than the primary voltage that is being measured. In order to resolve this issue, the combined current and voltage sensor includes a Faraday cage shields the sensors so that they mainly pick up the electric field in the direction of the ground plane. The Faraday cage is generally effective enough that the earth produces a significant stronger signal to the current and voltage sensors than the cross talk coming from other voltage sources, such as other phases and power lines. These other voltage sources may be closer to the sensors than the earth, but they have smaller areas. The cross-talk contamination signals are a combination of the signals emanating from the earth and the other voltage sources. Determining the actual value of the cross-talk may be resolved by having other combined current and voltage sensors on the voltage sources making similar measurements. Multiple sensor signals are then transmitted to a common controller, which uses the combined signals to compute mathematical corrections to nullify the contamination effect of all of the measurements.

Pointing the antenna patch sensor directly toward the earth and positioning a corona ring around the outer perimeter of the circuit board carrying the voltage sensor provides additional directionality benefits. Field tests show that these techniques alone reduce the magnitude error to about 10%. Adding in other voltage signals to aid with mathematical corrections provides additional improvement in accuracy. The resulting voltage, current and phase angle solutions are more robust as the cross contamination is significantly less. With line currents, faults can generate very high signals which make the current measurement difficult to deal with in actual field conditions. While the voltage sensor has high impulses that can affect the measurements, they are very short in duration and hence are not significant in decision making rules. System voltages are much more stable and predictable than system currents across different sites. The sensor distance from field source is much smaller than the distance from other sources, which increases the accuracy of the measurement. Using temperature and humidity sensors further improve accuracy. As a result, voltage, current and phase angle measurements between the voltage and current become sufficiently accurate to allow electric power system decisions to be based on these measurements, such as sectionalizing switch operation based on direction-to-fault and distance-to-fault computations.

Additionally, calibration can be difficult when there are other voltages present and when there are all three phase currents present. In this case, when one interrupts a line current on a three-phase circuit, there is a time where each phase is interrupted with a stagger between them. In this time the last phase to clear or interrupt is the only true signal for a little over a millisecond. This is enough time to self-calibrate the system. Multiple line operations will cause this to occur on other phases such that this calibration can occur on all three phases from random switch opening. This approach is much easier to implement in the field than to specifically put voltage and current through each phase one at a time, which would take field crews significant time to isolate individual phases in order to accomplish this calibration.

It should be understood that the foregoing relates only to the exemplary embodiments of the present invention, and that numerous changes may be made therein without departing from the spirit and scope of the invention as defined by the following claims.

The invention claimed is:

1. An electric power current and voltage monitoring device for an overhead electric power line, comprising:
  a sensor body comprising a flange and a base, wherein the flange defines an aperture receiving the overhead electric power line extending through the aperture with the aperture positioned transverse to and spaced apart from the power line, and with the base positioned parallel to and spaced apart from the power line;
  an electronics board disposed in the base carrying a voltage sensor operative to measure an electric voltage on the power line, an antenna, and electronic components comprising a microprocessor, a memory and a radio operatively connected to the antenna;

a current sensing coil disposed in the flange surrounding the aperture operative to measure an electric current flowing in the power line;

a power supply coil disposed in the flange surrounding the aperture configured to harvest electric power from the power line to electrically power to the electronic components to cause the antenna to wirelessly transmit the measured voltage and current; and a bracket supporting the monitoring device from a support structure supporting the power line positioning the monitoring device to maintain an air space surrounding the power line between the monitoring device and the power line.

2. The electric power current and voltage monitoring device of claim 1, further comprising an antenna shield carried by the electronics board shielding the antenna from electromagnetic interference from the power line.

3. The electric power current and voltage monitoring device of claim 2, wherein the voltage sensor and the antenna are disposed on a side of the electronics board, and the electronic components and the antenna shield are disposed on an opposing side of the electronics board.

4. The electric power current and voltage monitoring device of claim 1, further comprising a Faraday cage shielding the current sensing coil and the electronics board from electromagnetic interference from sources other than the power line.

5. The electric power current and voltage monitoring device of claim 1, further comprising a corona ring positioned adjacent to the base.

6. The electric power current and voltage monitoring device of claim 1, wherein:

the antenna comprises a first foil patch antenna element disposed on the electronics board operated at a first radio frequency and a second foil patch antenna element disposed on the electronics board operated at a second radio frequency; and the voltage sensor comprises a third foil patch antenna element disposed on the electronics board operated at a third radio frequency and a fourth foil patch antenna element disposed on the electronics board operated at a fourth radio frequency.

7. The electric power current and voltage monitoring device of claim 6, wherein the first foil patch antenna element transmits communication signals having a first polarity, and the second foil patch antenna element transmits communication signals having a second polarity that is orthogonal to the first polarity.

8. The electric power current and voltage monitoring device of claim 1, wherein the support structure comprises an insulator supporting the overhead electric power line.

9. An electric power current and voltage monitoring system for an overhead electric power line connected to an electric power switch, comprising:

a bracket supporting an electric power current and voltage monitoring device from a support structure supporting the switch to maintain an air space surrounding the overhead power line between the power line and the monitoring device;

the electric power current and voltage monitoring device comprising:

a sensor body comprising a flange and a base, wherein the flange defines an aperture with the power line extending through the aperture with the aperture positioned transverse to and spaced apart from the power line, and with the base positioned parallel to and spaced apart from the power line, an electronics board disposed in the base carrying a voltage sensor operative to measure an electric voltage on the power line, an antenna, and electronic components comprising a microprocessor, a memory and a radio operatively connected to the antenna, a current sensing coil disposed in the flange surrounding the aperture operative to measure an electric current flowing in the power line, and a power supply coil disposed in the flange surrounding the aperture configured to harvest electric power from the power line to electrically power to the electronic components to cause the antenna to wirelessly transmit the measured voltage and current;

a controller receiving the voltage and current measurements from the electric power current and voltage monitoring device and generating a switch operation signal based on one or both of the voltage and current measurements; and a switch actuator operative to operate the switch based on the switch operation signal received from the controller.

10. The electric power current and voltage monitoring system of claim 9, further comprising a remote transmission unit operative to receive the current and voltage measurements and transmit the current and voltage measurements to a control center.

11. The electric power current and voltage monitoring system of claim 9, further comprising an antenna shield carried by the electronics board shielding the antenna from electromagnetic interference from the power line.

12. The electric power current and voltage monitoring system of claim 9, wherein the voltage sensor and the antenna are disposed on a side of the electronics board, and the electronic components and the antenna shield are disposed on an opposing side of the electronics board.

13. The electric power current and voltage monitoring system of claim 9, further comprising a Faraday cage shielding the current sensing coil and the electronics board from electromagnetic interference from sources other than the power line.

14. The electric power current and voltage monitoring system of claim 9, further comprising a corona ring positioned adjacent to the base.

15. The electric power current and voltage monitoring system of claim 9, wherein:

the antenna comprises a first foil patch antenna element disposed on the electronics board operated at a first radio frequency and a second foil patch antenna element disposed on the electronics board operated at a second radio frequency; and the voltage sensor comprises a third foil patch disposed on the electronics board operated at a third radio frequency and a fourth foil patch disposed on the electronics board operated at a fourth radio frequency.

16. The electric power current and voltage monitoring system of claim 15, wherein the first foil patch antenna element transmits communication signals having a first polarity, and the second foil patch antenna element transmits communication signals having a second polarity that is orthogonal to the first polarity.

17. A method for monitoring an overhead electric power line connected to an electric power switch, comprising:

connecting a bracket to the switch;

connecting an electric power current and voltage monitoring device to the bracket from a structure supporting the switch to maintain an air space surrounding the overhead power line between the power line and the monitoring device;

the electric power current and voltage monitoring device comprising:
- a sensor body comprising a flange and a base, wherein the flange defines an aperture with the power line extending through the aperture with the aperture positioned transverse to and spaced apart from the power line, and with the base positioned parallel to and spaced apart from the power line,
- an electronics board disposed in the base carrying a voltage sensor operative to measure an electric voltage on the power line, an antenna, and electronic components comprising a microprocessor, a memory and a radio operatively connected to the antenna,
- a current sensing coil disposed in the flange surrounding the aperture operative to measure an electric current flowing in the power line, and
- a power supply coil disposed in the flange surrounding the aperture configured to harvest electric power from the power line to electrically power to the electronic components to cause the antenna to wirelessly transmit the measured voltage and current;

generating a switch operation signal based on one or both of the voltage and current measurements; and operating the switch based on the switch operation signal.

18. The method of claim 17, further comprising transmitting current and voltage measurements from the monitoring device to a control center.

19. The method of claim 17, further comprising positioning an antenna shield on the electronics board to shield the antenna from electromagnetic interference from the power line.

20. The method of claim 17, further comprising positioning a Faraday cage to shield the current sensing coil and the electronics board from electromagnetic interference from sources other than the power line and a corona ring adjacent to the base.

* * * * *